United States Patent
Deguchi

(10) Patent No.: US 6,473,151 B1
(45) Date of Patent: Oct. 29, 2002

(54) SUBSTRATE PROCESSING APPARATUS

(75) Inventor: Masatoshi Deguchi, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/558,545

(22) Filed: Apr. 26, 2000

(30) Foreign Application Priority Data

Apr. 28, 1999 (JP) .......................... 11-121732

(51) Int. Cl.$^7$ .................. G03B 27/32; C23C 16/00; B65G 25/00
(52) U.S. Cl. .................. 355/27; 427/10; 118/719; 414/152
(58) Field of Search .................. 355/27; 396/604, 396/611; 118/719, 715, 720; 414/225.01, 152; 430/311, 330; 427/8, 10

(56) References Cited

U.S. PATENT DOCUMENTS

| | | | |
|---|---|---|---|
| 5,664,254 A | | 9/1997 | Ohkura et al. .............. 396/612 |
| 5,844,662 A | * | 12/1998 | Akimoto et l. .............. 355/27 |
| 5,897,710 A | * | 4/1999 | Sato et al. .............. 427/8 |
| 5,937,223 A | * | 8/1999 | Akimoto et al. .............. 396/604 |
| 5,944,894 A | * | 8/1999 | Kitano et al. .............. 118/326 |
| 6,008,978 A | * | 12/1999 | Tateyama .............. 361/212 |
| 6,161,969 A | * | 12/2000 | Kimura et al. .............. 396/611 |
| 6,228,561 B1 | * | 5/2001 | Hasebe et al. .............. 430/311 |

FOREIGN PATENT DOCUMENTS

| | | |
|---|---|---|
| JP | 9-45613 | 2/1997 |
| JP | 11-233421 | 8/1999 |

* cited by examiner

Primary Examiner—Russell Adams
Assistant Examiner—Peter B. Kim
(74) Attorney, Agent, or Firm—Rader, Fishman & Grauer PLLC

(57) ABSTRACT

A substrate processing apparatus has a film forming unit group disposed along a first transfer route and a developing processing unit group disposed along a second transfer route. A substrate is transferred along the first transfer route, undergoes film forming processing in the film forming unit group, and thereafter undergoes exposure processing. After undergoing exposure processing, the substrate is transferred along the second transfer route and undergoes developing processing in the developing unit group. The unit groups in which different sorts of processing are performed are disposed along the different transfer routes as described above, thereby enabling the substrate to be transferred efficiently.

14 Claims, 8 Drawing Sheets

SUBSTRATE PROCESSING APPARATUS

BACKGROUND OF THE INVENTION

1. Field of the Invention

The present invention relates to a substrate processing apparatus for processing a substrate such as a semiconductor wafer, an LCD substrate, or the like.

2. Description of the Related Art

In lithography in semiconductor device fabrication, for example, first a resist solution is applied onto a front surface of a substrate such as a semiconductor wafer (hereinafter referred to as "a wafer") or the like to form a resist film in a substrate processing apparatus. Thereafter, the wafer is transferred to an aligner different from the substrate processing apparatus to be exposed. The exposed wafer is transferred again to the substrate processing apparatus where the wafer is supplied with a developing solution to be subjected to developing processing.

Incidentally, in the substrate processing apparatus, various processing units such as a resist coating processing unit for applying a resist solution to the wafer and processing it, a heat processing unit for performing heat processing for the wafer after resist coating processing or for the wafer after exposure processing, a cooling unit for performing cooling processing for the wafer after heat processing, a developing unit for supplying a developing solution to the wafer and performing developing processing for the wafer, and the like are provided individually. These units are multi-tiered. The wafer is transferred between the processing units and carried in and out of the processing unit by means of transfer means. The transfer means transfers the wafer to the various processing units in predetermined order.

SUMMARY OF THE INVENTION

The order of transfer of a wafer is considered conventionally, but the transfer route of the wafer is not considered very much. Therefore, in some cases, the transfer route of the wafer becomes complicated, and thus the wafer can not always be transferred efficiently. For example, there is a possibility of causing a harmful effect such that delay occurs in transfer of the wafer.

The present invention is made in view of the aforesaid respect, and an object of the present invention is to provide a new substrate processing apparatus capable of transferring a substrate efficiently without complicating a transfer route of the substrate by transfer means.

To attain the above object, one of main aspects of the present invention is a substrate processing apparatus, comprising a plurality of first processing units, disposed along a first transfer route, each for processing a substrate, a plurality of second processing units, disposed along a second transfer route, for processing the substrate after the substrate processed in the first processing unit is processed in a processing apparatus, and transfer means for transferring the substrate between the plurality of first processing units disposed along the first transfer route and transferring the substrate between the plurality of second processing units disposed along the second transfer route.

According to the aforesaid structure of the present invention, the substrate is transferred through the first transfer route by means of the transfer means until the substrate is carried into the processing apparatus, for example, an aligner, and processed in the first processing units disposed along the first transfer route. Subsequently, after being transferred to the different processing apparatus and processed therein, the substrate is transferred through the second transfer route different from the first transfer route by means of the transfer means, and processed in one, or two or more processing units disposed along the second transfer route. The substrate is transferred through the first transfer route and the second transfer route which are independent of each other, thereby preventing the complication of the first transfer route and the second transfer route.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
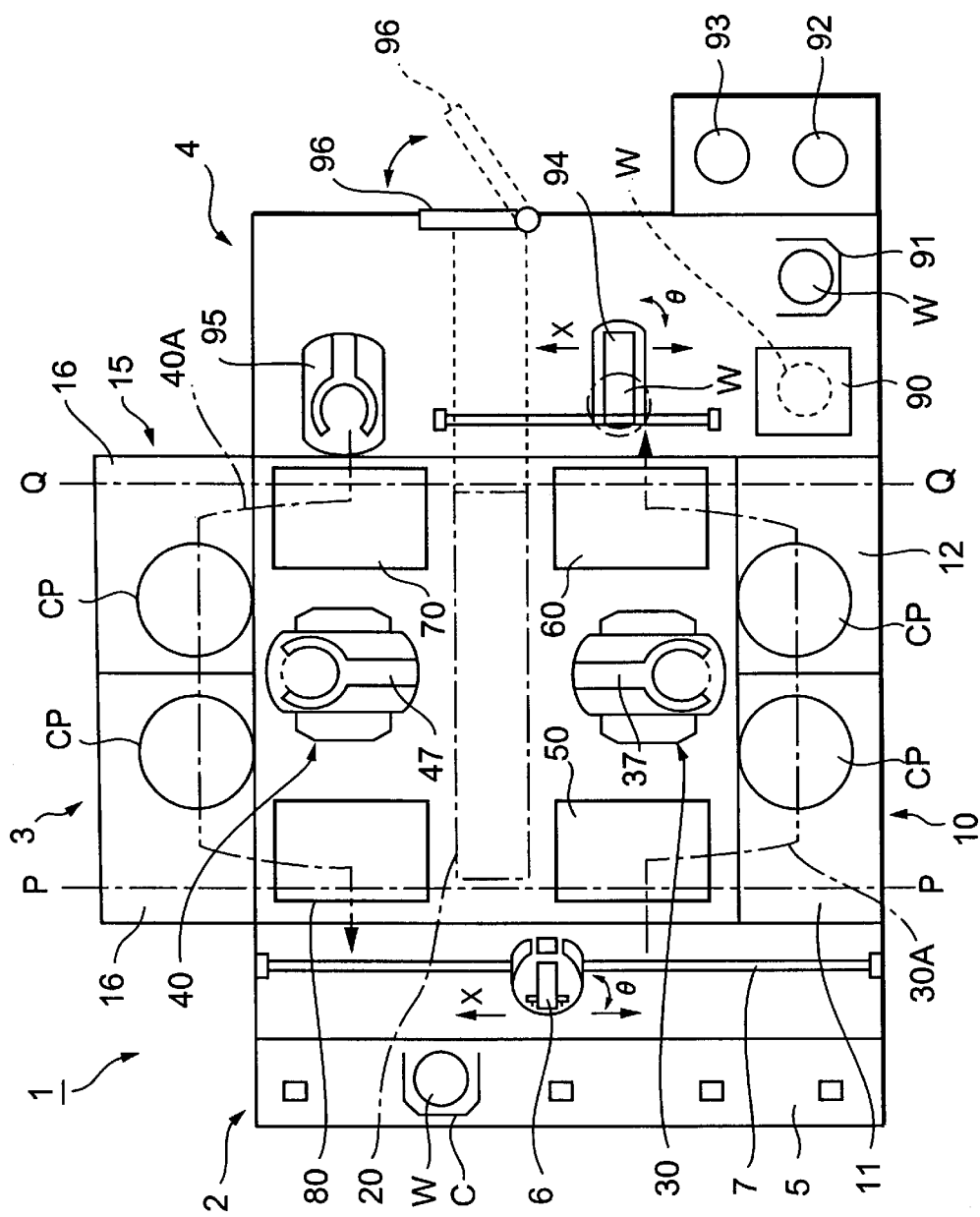
FIG. 1 is a plan view of a substrate processing apparatus according to a first embodiment of the present invention.

FIG. 1 shows a schematic plan view of a substrate processing apparatus according to the present embodiment.

The substrate processing apparatus 1 has structure in which a cassette station 2 for transferring, for example, 25 wafers W per cassette, as a unit, from/to the outside into/from the substrate processing apparatus 1 and carrying the wafer W into/out of a cassette C, a processing station 3 in which various kinds of processing units each for performing predetermined processing for the wafers W one by one are multi-tiered, and an interface section 4 for transferring the wafer W to/from an aligner (not illustrated) adjacent to the processing station 3 are integrally connected.

In the cassette station 2, the cassettes C can be freely mounted with respective transfer ports for the wafer W facing the side of the processing station 3 on a cassette mounting table 5 in an X-direction (a vertical direction in FIG. 1). A wafer transfer body 6 movable in the direction of arrangement of the cassettes C (the X-direction) and in the direction of arrangement of the wafers W housed in the cassette C (a Z-direction; a vertical direction) is movable along a transfer path 7 and selectively accessible to each of the cassettes C. The wafer transfer body 6 is also structured to be rotatable in a θ-direction so as to be accessible to an extension unit 54 of a first heat processing unit group 50 and an extension and cooling unit 82 and an extension unit 83 of a fourth heat processing unit group 80, which will be described later.

In the processing station 3, a film forming unit group 10 is arranged on the front side, and a developing processing unit group 15 is arranged on the rear side, respectively.

In the film forming unit group 10, antireflection film forming units 11 each for forming an antireflection film on a wafer W housed in a cup CP and resist coating processing units 12 each for forming a resist film on a wafer W housed in a cup CP are arranged in two rows while being three-tiered respectively. A chemical box (not illustrated) capable of housing a resist solution supply tank (not illustrated) for supplying a resist solution to the wafer W and the like is provided under the film forming unit group 10.

The developing processing unit group 15 is composed of developing processing units 16 each for supplying a developing solution to the wafer W housed in a cup CP and processing it, and the developing processing units 16 are disposed in two rows while being two-tiered. A chemical box (not illustrated) capable of housing a developing solution supply tank (not illustrated) for supplying a developing solution to the wafer W is provided under the developing processing unit group 15.

A space portion 20 is formed in the central portion of the processing station 3, and the space portion 20 communicates with a door 96 which is provided in the interface section 4 to freely open and shut and described later. The film forming units group 10 and the developing processing units group 15 are disposed facing each other with a space between them across the space portion 20. A first transfer means 30 for transferring the way for W which is arranged between the film forming units group 10 and the space portion 20 and a second transfer means forty-four transferring the way for W which is arranged between the developing processing units group 15 and the space portion 20 are disposed facing each other.

Figure 2:
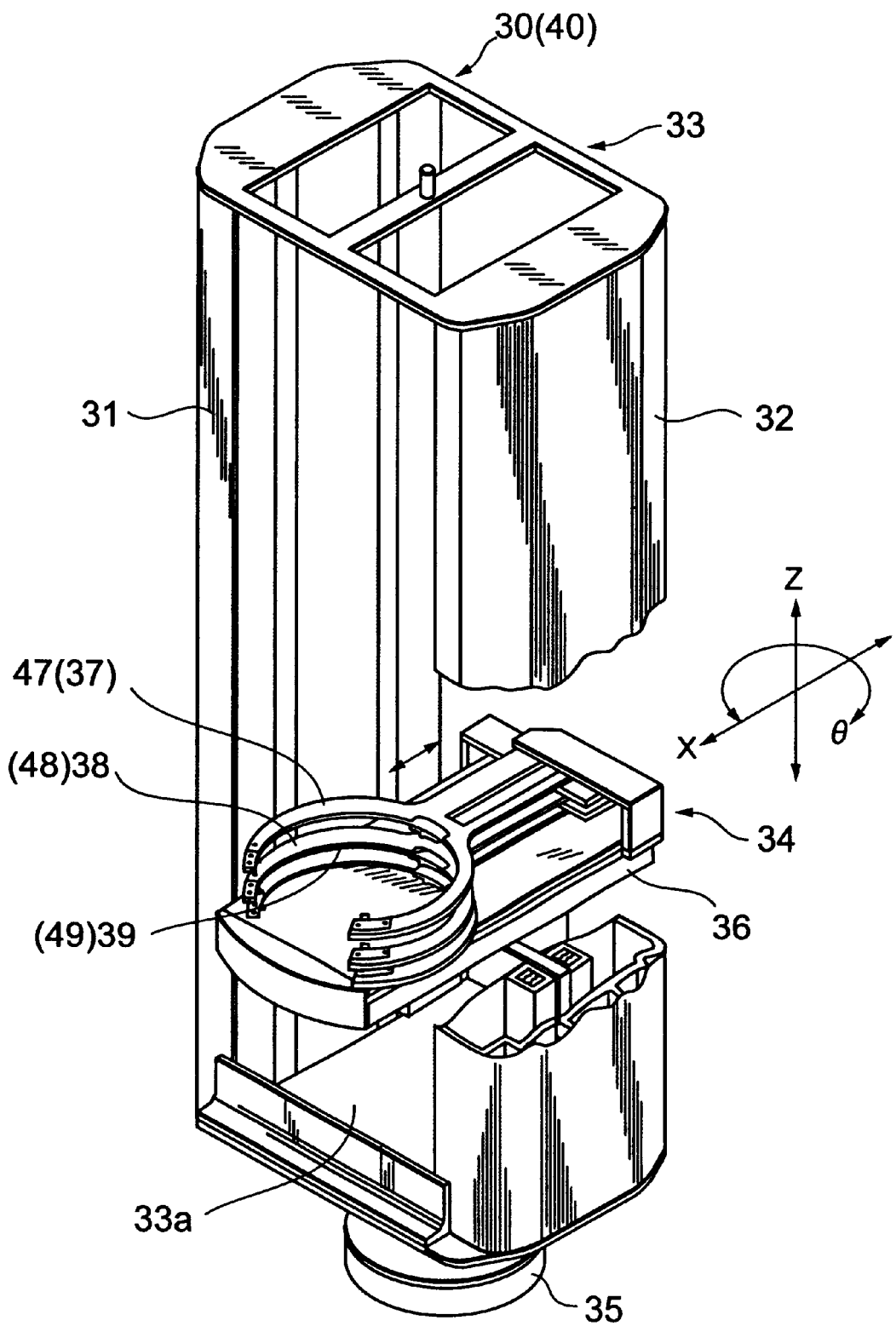
FIG. 2 is a perspective view showing the structure of a first transfer means provided in the substrate processing apparatus in FIG. 1.

The first transfer means 30 transfers the wafer W before exposure processing through a first transfer route 30A, and the second transfer means 40 transfers the wafer W after exposure processing through a second transfer route 40A. The first transfer means 30 and the second transfer means 40 have basically the same structure, and the structure of the first transfer means 30 is explained based on FIG. 2. The first transfer means 30 is provided with a wafer transfer mechanism 34 which is ascendable and descendable in the vertical direction (the Z-direction) inside a cylindrical supporter 33 composed of a pair of wall portions 31 and 32 which are connected each other at respective upper ends and lower ends and face each other. The cylindrical supporter 33 is connected to a rotating shaft of a motor 35 and rotates integrally with the wafer transfer mechanism 34 around the aforesaid rotating shaft by the motor 35. Accordingly, the wafer transfer mechanism 34 is rotatable in the θ-direction.

Three tweezers 37, 38, and 39 for holding the wafer W are disposed on a transfer base 36 of the wafer transfer mechanism 34 respectively at the upper, middle, and lower positions. These three tweezers 37, 38, and 39 have basically the same structure and each have a shape and a size capable of freely passing through a side opening 33a of the cylindrical supporter 33. The tweezers 37, 38, and 39 are movable back and forth by a motor (not illustrated) contained in the transfer base 36. Incidentally, the second transfer means 40 is provided with tweezers 47, 48, and 49 which have the same function and structure as the tweezers 37, 38, and 39 at the upper, middle, and lower positions, respectively.

The first heat processing unit group 50 as film forming pre-processing units and a second heat processing unit group 60 are disposed respectively on both sides of the first transfer means 30, and a third heat processing unit group 70 and the fourth heat processing unit group 80 as developing post-processing units are disposed respectively on both sides of the second transfer means 40. The first heat processing unit group 50 and the fourth heat processing unit group 80 are arranged on the cassette station 2 side, and the second heat processing unit group 60 and the third heat processing unit group 70 are arranged on the interface section 4 side, respectively.

In the substrate processing apparatus, the film forming unit group 10 in which a plurality of units as first processing units are piled on top of one another, the first heat processing unit group 50, and the second heat processing unit group 60 are arranged along the first transfer route 30A. The developing processing unit group 15 in which a plurality of units as second processing units are piled on top of one another, the third heat processing unit group 70, and the fourth heat processing unit group 80 are arranged along the second transfer route 40A.

Figure 3:
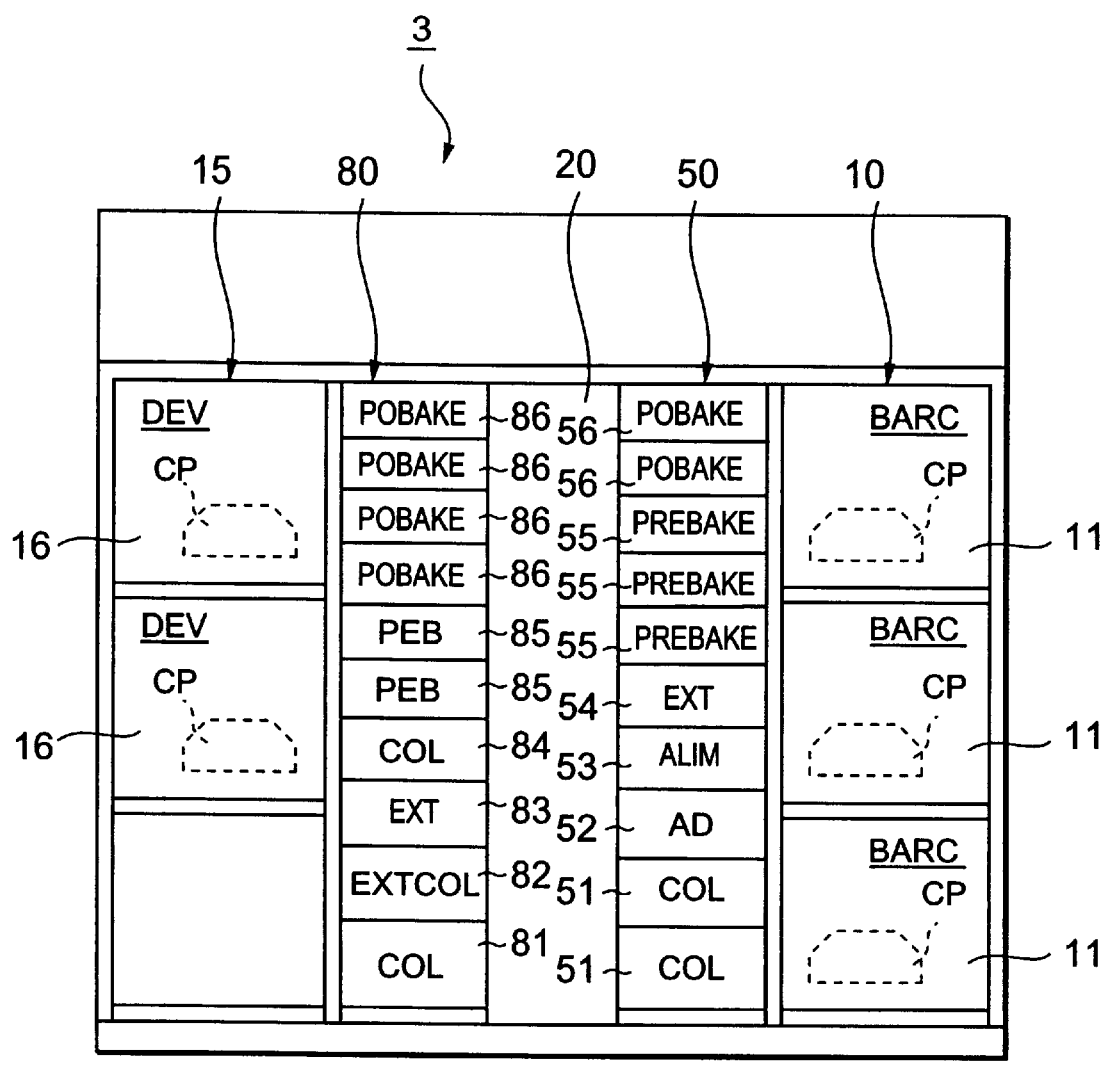
FIG. 3 is a side view of the substrate processing apparatus in FIG. 1 as seen from a cassette station side.

The structure of the first heat processing unit group 50 and the fourth heat processing unit group 80 is explained here based on FIG. 3 showing a sectional view taken along the line P—P of the processing station 3 as seen from the cassette station 2 side. In the first heat processing unit group 50, cooling units 51 and 51 each for performing cooling processing for the wafer W, an adhesion unit 52 for performing hydrophobic processing for the front surface of the wafer W, an alignment unit 53 for aligning the wafer W, an extension unit 54 for making the wafer W wait, pre-baking units 55, 55, and 55 each for performing heat processing for the wafer W after resist coating processing, and post-baking units 56 and 56 each for performing heat processing for the wafer W after developing processing are ten-tiered from the bottom in order.

Meanwhile, in the fourth heat processing unit group 80, a cooling unit 81, an extension and cooling unit 82 for cooling the wafer W which is made to wait, an extension unit 83, a cooling unit 84, post-exposure baking units 85 and 85 each for performing heat processing for the wafer W after exposure processing, and post-baking units 86, 86, 86, and 86 each for performing heat processing for the wafer W after developing processing are ten-tiered from the bottom in order.

Figure 4:
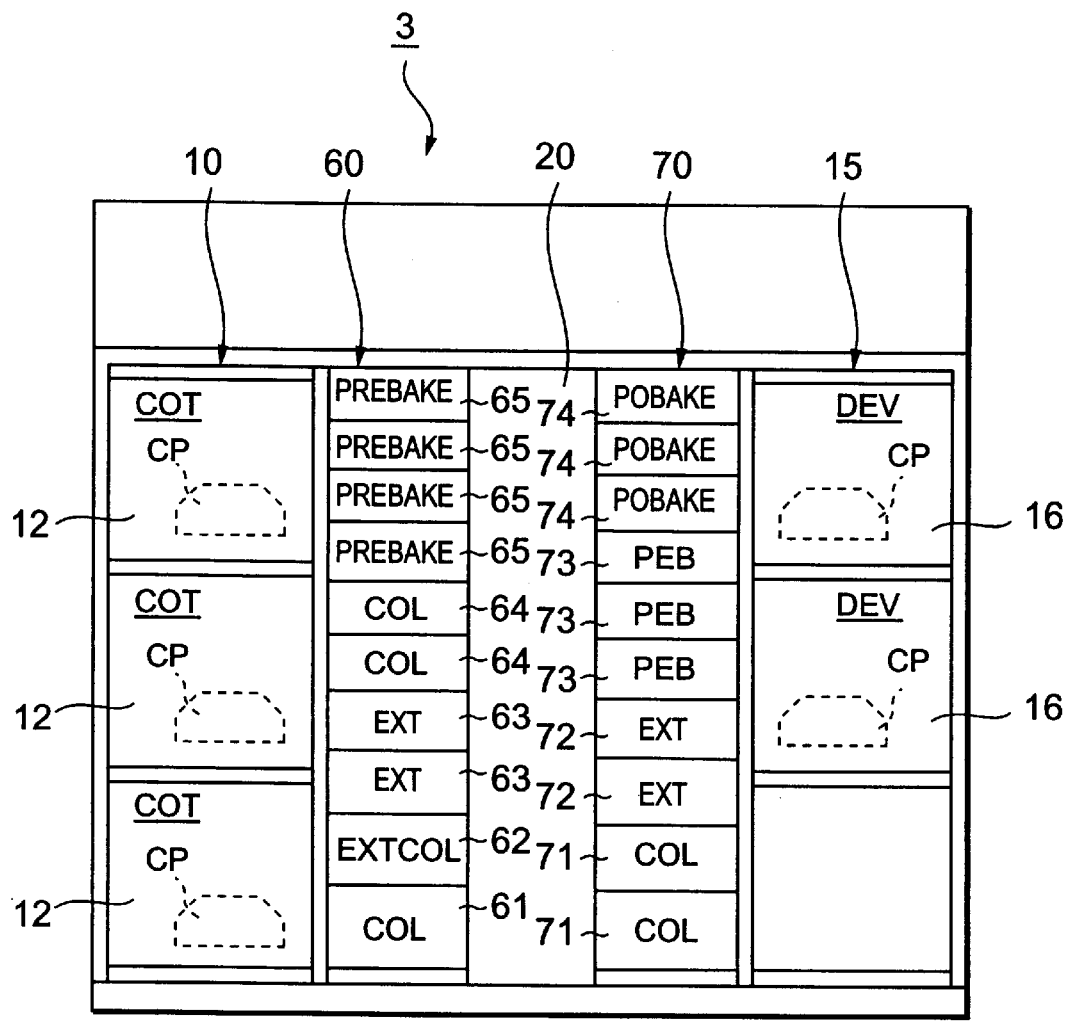
FIG. 4 is a side view of the substrate processing apparatus in FIG. 1 as seen from an interface section side.

The structure of the second heat processing unit group 60 and the third heat processing unit group 70 is explained based on FIG. 4 showing a sectional view taken along the line Q—Q of the processing station 3 as seen from the interface section 4 side. In the second heat processing unit group 60, a cooling unit 61, an extension and cooling unit 62, extension units 63 and 63, cooling units 64 and 64, and pre-baking units 65, 65, 65, and 65 are ten-tiered from the bottom in order.

Meanwhile, in the third heat processing unit group 70, cooling units 71 and 71, extension units 72 and 72, post-exposure baking units 73, 73, and 73, and post-baking units 74, 74, and 74 are ten-tired from the bottom in order.

In the interface section 4, a peripheral aligner 90 for exposing the peripheral portion of the wafer W, a cassette 91 capable of housing the wafer W, a cooling mounting table 92 on which the wafer W exposed in the aligner (not illustrated) is mounted and cooled, a wafer transfer body 93 for transferring the wafer W between the cassette 91, the cooling mounting table 92, and the aligner (not illustrated), and a wafer transfer body 94 for transferring the wafer W between the extension units 63 and 63 of the second heat processing unit group 60, the peripheral aligner 90, and the cassette 91 are provided.

A sub-transfer body 95 is provided on the opposite side to the peripheral aligner 90 across the wafer transfer body 94. The sub-transfer body 95 is able to receive the wafer W transferred by the wafer transfer body 94 and carry the wafer W into the extension units 72 and 72 of the third heat processing unit group 70. Further provided in the interface section 4 is the aforesaid door 96 which freely opens and shuts and communicates with the space portion 20 of the processing station 3, so that an operator can enter the space portion 20 from the interface section 4 by opening the door 96.

The substrate processing apparatus 1 according to the embodiment of the present invention is structured as above. Next, operational effects of the substrate processing apparatus 1 will be explained.

When the cassette C housing, for example, 25 unprocessed wafers W is mounted on the cassette mounting table 5, the wafer transfer body 6 gets access. to the cassette C to take out one unprocessed wafer W. This wafer W is transferred to various kinds of processing units in sequence through the first transfer route 30A by means of the first transfer means 30 until the wafer W is transferred to the aligner (not illustrated) as a different processing apparatus to be exposed.

Specifically, the wafer W taken out by the wafer transfer body 6 is transferred to the extension unit 54 of the first heat processing unit group 50. The wafer W in the extension unit 54 is then take out by the first transfer means and transferred to the alignment unit 53 of the first heat processing unit group 50, and predetermined alignment is performed in the alignment unit 53. Subsequently, the wafer W is transferred to the adhesion unit 52 of the same first heat processing unit group 50 while held by the tweezers 39 provided in the first transfer means 30. The wafer W for which hydrophobic processing is performed in the adhesion unit 52 is transferred to the antireflection film forming unit 11 of the film forming unit group 10 while held by the tweezers 39.

While held by the tweezers 38 of the first transfer means 30, the wafer W on which an antireflection film is formed in the antireflection film forming unit 11 is transferred to the resist coating processing unit 12, where a resist film is formed on the upper surface of the antireflection film. Subsequently, the wafer W is transferred to the pre-baking unit 65 of the second heat processing unit group 60 to undergo heat processing while held by the tweezers 37 of the first transfer means 30.

While held by the tweezers 39 of the first transfer means 30, the wafer W for which the above heat processing is completed is transferred to the extension and cooling unit 62 of the second heat processing unit group 60 to be cooled to a predetermined temperature and then stands by there. Thus, the transfer of the wafer W through the first transfer route 30A by means of the first transfer means 30 is completed.

Thereafter, the wafer W is carried out of the extension and cooling unit 62 by the wafer transfer body 94 and transferred to the peripheral aligner 90. The wafer W of which an unnecessary resist film at the peripheral portion is removed in this peripheral aligner 90 is transferred to the aligner (not illustrated) as a different processing apparatus to be exposed.

The exposed wafer W is mounted on the cooling mounting table 92 by the wafer transfer body 93 and cooled thereon, and thereafter delivered to the wafer transfer body 94 to be transferred. After being delivered from the wafer transfer body 94 to the sub-transfer body 95, the wafer W is transferred to the extension unit 72 of the third heat processing unit group 70 by the sub-transfer body 95 and stands by there. The wafer W waiting in the extension unit 72 is transferred to various processing units through the second transfer route 40A by means of the second transfer means 40.

Specifically, the wafer W is transferred from the extension unit 72 to the post-exposure baking unit 73 by means of the second transfer means 40, and thereafter heat processing after exposure processing for the wafer W is performed. The wafer W for which the heat processing after exposure processing is completed is transferred to the cooling unit 71 to undergo cooling processing while held by the tweezers 49 of the second transfer means 40, and then transferred to the developing processing unit 16 of the developing processing unit group 15 to undergo developing processing.

The wafer W after developing processing is transferred to the post-baking unit 86 of the fourth heat processing unit group 80 to undergo heat processing while held by the tweezers 47. Subsequently, the wafer W after post-baking processing is transferred to the cooling unit 81 of the fourth heat processing unit group 80 to undergo cooling processing while held by the tweezers 49. The wafer W is then transferred from the cooling unit 81 to the extension unit 83 and stands by there. Thus, the transfer of the wafer W through the second transfer route 40A by means of the second transfer means 40 is completed.

The wafer W is then transferred from the extension unit 83 to the cassette C on the cassette mounting table 5 by the wafer transfer body 6 and housed therein. Thus, a series of processing for the wafer W is completed.

In the substrate processing apparatus 1 according to the embodiment of the present invention, the wafer W is transferred through the first transfer route 30A by means of the first transfer means 30 until the wafer W is transferred to the aligner (not illustrated) to undergo processing. Namely, the wafer W is transferred to the first heat processing unit group 50, the film forming unit group 10, and the second heat processing unit group 60 in that order, and thereafter transferred to the aligner (not illustrated) to be exposed. Subsequently, the wafer W for which exposure is completed is transferred this time through the second transfer route 40A by means of the second transfer means 40 until the wafer W is housed in the cassette C. Namely, the wafer W is transferred to the third heat processing unit group 70, the developing processing unit group 15, and the fourth heat processing unit group 80 in that order, and thereafter housed in the cassette C, and thus a series of processing is completed.

The wafer W is transferred through the first transfer route 30A and the second transfer route 40A independent of each other, whereby the complication of the first transfer route 30A and the second transfer route 40A can be prevented.

The wafer W before being processed in the aligner (not illustrated) is transferred by the first transfer means 30, and the wafer W which has already been processed in the aligner (not illustrated) is transferred by the second transfer means 40 different from the first transfer means 30. In other words, the transfer of the wafer W is shared between the first and second transfer means 30 and 40. As a result, transfer distances of the wafer W by means of the first and second transfer means 30 and 40 are shortened respectively, thereby reducing loads of the transfer means 30 and 40 in transferring the wafer W as compared with a case where the wafer W is transferred by means of one transfer means as in prior arts. Accordingly, also from this point, the complication of the transfer route of the wafer W can be prevented, which makes it possible to transfer the wafer W efficiently.

The space portion 20 which communicates with the door 96 is formed in the central portion of the processing station 3 between the first transfer route 30A and the second transfer route 40A, which allows the operator to open the door 96 and get into the space portion 20 to make an inspection and maintenance of each processing unit.

Next, a substrate processing apparatus according to a second embodiment of the present invention will be explained.

Figure 5:
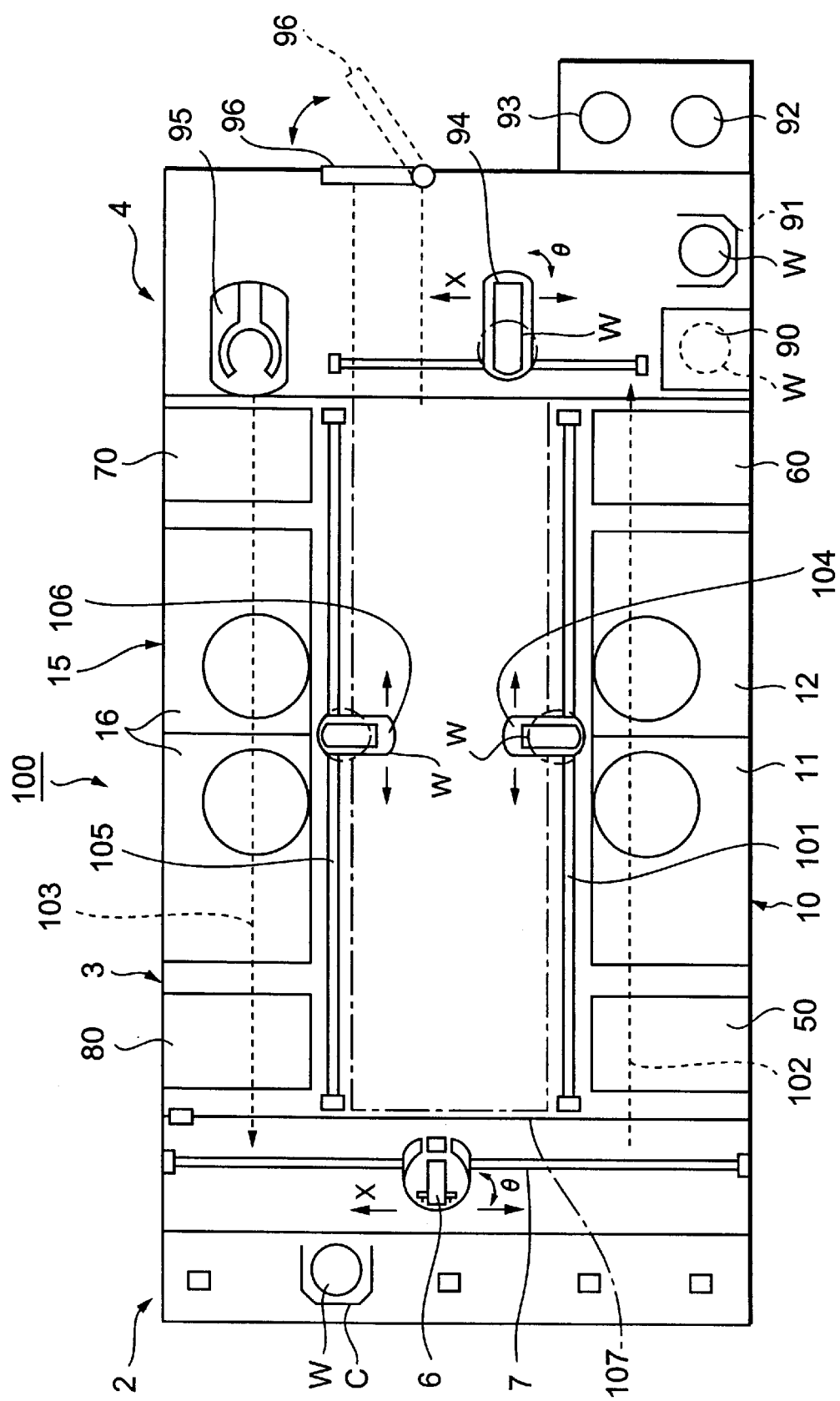
FIG. 5 is a plan view of a substrate processing apparatus according to a second embodiment of the present invention.

In this substrate processing apparatus 100, a first transfer means 104 movable back and forth on a transfer rail 101 provided in the cassette station 3 for transferring the wafer W to various processing units arranged along a first transfer route 102, and a second transfer means 106 movable back and forth on a transfer rail 105 facing the transfer rail 101 for transferring the wafer W to various processing units arranged along a second transfer route 103 are provided as shown in FIG. 5. The first transfer route 102 and the second transfer route 103 are formed to be almost parallel to each other, and a space portion 107 which the operator can enter from the interface section 4 by opening the door 96 which freely opens and shuts is formed between the first transfer route 102 and the second transfer route 103.

The first transfer route 102 and the second transfer route 103 are disposed almost parallel to each other according to the substrate processing apparatus 100, whereby various processing units each for processing the wafer W before exposure processing and various processing units each for processing the wafer W after exposure processing are arranged almost parallel to each other. Hence, the operator who enters the space portion 107 formed between the first and second transfer routes 102 and 103 can make an inspection and maintenance of the various processing units arranged almost parallel to each other more easily while moving along the space portion 107.

Figure 6:
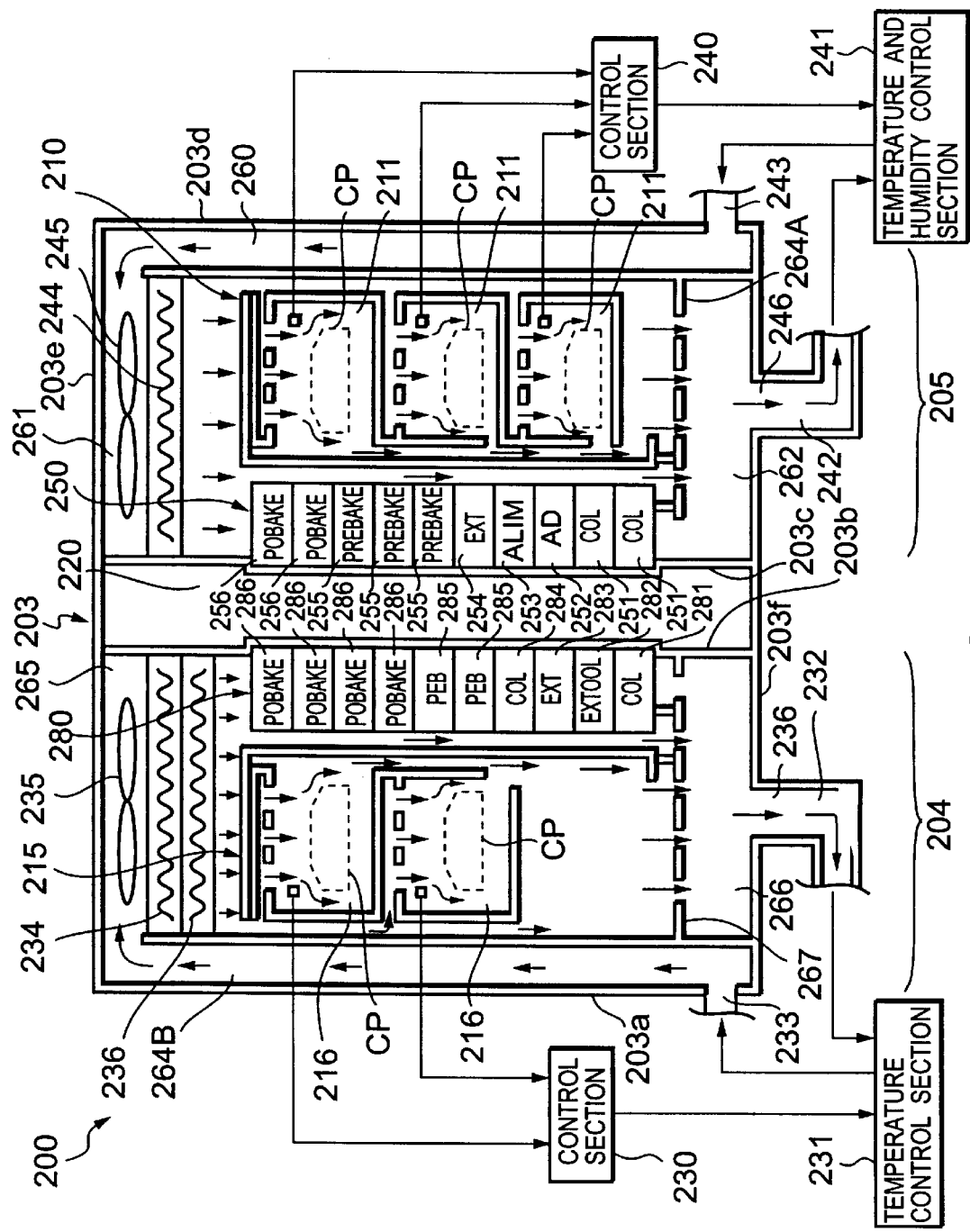
FIG. 6 is a side view of a substrate processing apparatus according to a third embodiment of the present invention as seen from a cassette station side.

Next, a substrate processing apparatus according to a third embodiment of the present invention will be explained by means of FIG. 6. The substrate processing apparatus 200 of this embodiment is different from the substrate processing apparatus of the first embodiment in that a cleaning mechanism such as a chemical filter is provided, but they are the same in all other aspects of the structure, and thus the cleaning mechanism only will be explained. In FIG. 6, a processing station 203 corresponds to the processing station 3 of the first embodiment. A space portion 220 corresponding to the space portion 20 of the first embodiment is formed in the central portion of the processing station 203. A first heat processing unit group 250 corresponds to the first heat processing unit group 50 of the first embodiment, and a fourth heat processing unit group 280 corresponds to the fourth heat processing unit group 80 of the first embodiment. A film forming unit group 210 corresponds to the film forming unit group 10 of the first embodiment, and a developing processing unit group 215 corresponds to the developing processing unit group 15 of the first embodiment. An antireflection film forming unit 211 corresponds to the antireflection film forming unit 11 of the first embodiment, and a developing processing unit 216 corresponds to the developing processing unit 16 of the first embodiment. Similarly to the first embodiment, the film forming unit group 210, the first heat processing unit group 250, resist coating processing units, a second heat processing unit group are arranged along a first transfer route, and the developing processing unit group 215, the fourth heat processing unit group 280, and a third heat processing unit group are arranged along a second transfer route.

In this embodiment, the inside of the processing station 203 is spatially divided into a first area 205 where a substrate is transferred along the first transfer route and a second area 204 where the substrate is transferred along the second transfer route. The first area 205 is enclosed by side plates 203c and 203d, a top plate 203e, and a base plate 203f. The second area 204 is enclosed by side plates 203a and 203b, the top plate 203e, and the base plate 203f. The film forming unit group 210, the first heat processing unit group 250, the resist coating processing units, and the second heat processing unit group are disposed in the first area 205. The developing processing unit group 215, the fourth heat processing unit group 280, and the third heat processing unit group are disposed in the second area 204. The insides of the first area 205 and the second area 204 each have downflow structure in which air in the area flows from the upper side to the lower side.

A vertical duct 260 is formed along the side plate 203d in the first area 205. A chemical filter 244 as an air cleaning mechanism is disposed at the upper portion inside the first area 205, and an upper space 261 is formed between the top plate 203e and the chemical filter 244. The upper space 261 communicates with the vertical duct 260. A fan 245 is disposed in the upper space 261. A perforated plate 264A is disposed at the bottom inside the first area 205, and a lower space 262 is formed between the base plate 203f and the perforated plate 264A. A large number of vent holes are formed in the perforated plate 264A so that downflow air inside the first area 205 flows into the lower space 262 through the vent holes.

An exhaust port 246 communicating with a circulating passage 242 is formed in the base plate 203f, and air inside the lower space 262 is sent to a temperature and humidity control section 241 as a first control mechanism via the circulating passage 242.

After the temperature and humidity of air exhausted from within the first area 205 are controlled in the temperature and humidity control section 241, the air passes through duct 260 and the upper space 261 via a supply passage 243 and is supplied again into the first area. The air supplied again passes through the chemical filter 244, whereby ammonia, amine, and the like are eliminated therefrom. The air from which ammonia, amine, and the like are eliminated is blown out downward and flows into the lower space 262 through the film forming unit group 210 and the resist coating unit group. Disposed in each unit of the film forming unit group 210 and the resist coating processing unit group is a control sensor for detecting temperature and humidity inside each unit. A detected result by the control sensor is sent to a control section 240, which controls the temperature and humidity control section 241 based on the detected result by the control sensor.

A vertical duct 264B is formed along the side plate 203a in the second area 204. A chemical filter 234 and an HEPA filter 236 each as an air cleaning mechanism are disposed at the upper portion inside the second area 204, and an upper space 265 is formed between the top plate 203e and the chemical filter 234. The upper space 265 communicates with the vertical duct 264B. A fan 235 is disposed in the upper space 265. A perforated plate 267 is disposed at the bottom inside the second area 204, and a lower space 266 is formed between the base plate 203f and the perforated plate 267. A large number of vent holes are formed in the perforated plate 267 so that downflow air inside the second area 204 flows into the lower space 266 through the vent holes.

An exhaust port 236 communicating with a circulating passage 232 is formed in the base plate 203f, and air inside the lower space 266 is sent to a temperature control section 231 as a second control mechanism via the circulating passage 232.

After the temperature of air exhausted from within the second area 204 is controlled in the temperature control section 231, the air passes through duct 264 and the upper space 265 via a supply passage 233 and is supplied again into the second area. The air supplied again passes through the chemical filter 234, whereby ammonia, amine, and the like are eliminated therefrom. Further, particles are removed from the air by the HEPA filter 236. Thereafter, the air is blown out downward and flows into the lower space 266 through respective units of the developing processing unit group 215. Disposed in each unit of the developing processing unit group 215 is a control sensor for detecting temperature inside each unit. A detected result by the control sensor is sent to a control section 230, which controls the temperature control section 231 based on the detected result by the control sensor. Incidentally, arrows in FIG. 6 show the flow of air.

Moreover, a chemical filter is provided at the upper portion of the interface section through which the wafer passes before being transferred into the second area after exposure processing.

In this embodiment, the chemical filters are disposed in the first area 205 where units for forming some film on the wafer are arranged and in the interface section where the exposed wafer is placed, and the HEPA filter in addition to the chemical filter is disposed in the second area 204 where units for performing developing processing are arranged. Incidentally, an HEPA filter for eliminating particles may be provided in addition to the chemical filter as a filter to be disposed in the first area 205. When two kinds of filters, an HEPA filter and a chemical filter, are provided, the order of disposition is not limited.

When a chemically amplified resist is used as a resist member, it is desirable to provide chemical filters in the interface section and in the second area 204 where the filters are to be disposed during a period from the completion of exposure processing for the wafer to the completion of developing processing therefor, thereby enabling alkaline components therein to be eliminated by the chemical filters. The chemically amplified resist member contains an acid generator and an acid sensitive substance in the resist, thereby generating acid by exposure processing. The acid sensitive substance reacts with an acid as a catalyst by heat processing following the exposure processing to change solubility of the resist. Accordingly, if alkaline components such as ammonia and amine exist in processing atmosphere, these alkaline components and an acid are neutralized and thus reaction does not progress. Therefore, when the chemically amplified resist member is used, it is important to eliminate alkaline components from processing atmosphere during a period from the completion of exposure processing to the completion of developing processing in order to advance reaction promptly, and it is desirable to dispose a chemical filter in a processing chamber where the wafer is to be disposed during a period from the completion of exposure processing to the completion of developing processing.

Further in this embodiment, as for air to be supplied into the first area 205 where units each for forming some film are disposed, temperature and humidity control is performed, while as for air to be supplied into the second area 204 where units each for performing developing processing are disposed, temperature control only is performed. This is because it is desirable to provide a mechanism for controlling the humidity of air to be supplied into the units where some film is formed since a change in humidity especially exerts an influence on film thickness when some film is formed on the substrate.

As described above, in this embodiment, the provision of filters in the substrate processing apparatus allows film forming processing and developing processing to be performed in clean air, and consequently a patterning film of high quality can be obtained.

Figure 7:
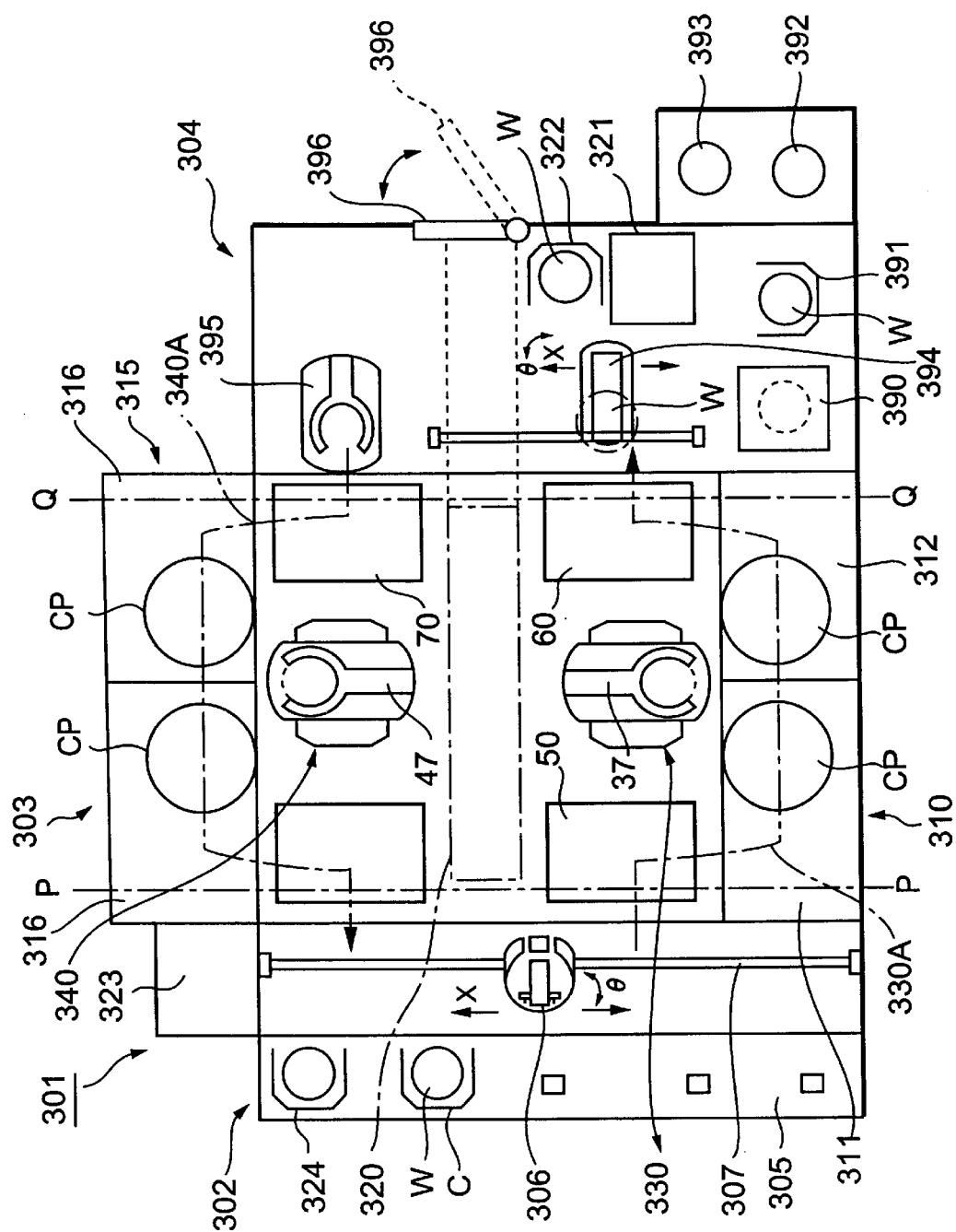
FIG. 7 is a plan view of a substrate processing apparatus according to a fourth embodiment of the present invention.

Next, a substrate processing apparatus according to a fourth embodiment of the present invention will be explained by means of FIG. 7. The substrate processing apparatus 301 of this embodiment is different from the substrate processing apparatus of the first embodiment in that the substrate processing apparatus 301 further includes first inspection equipment for inspecting a substrate processed along a first transfer route, a first defective substrate collecting means for collecting a substrate judged to be defective by the first inspection equipment, second inspection equipment for inspecting a substrate processed along a second transfer route, and a second defective substrate collecting means for collecting a substrate judged to be defective by the second inspection equipment. They are the same in all other aspects of the structure, and hence detailed explanation for the same respects is omitted.

The substrate processing apparatus 301 has structure in which a cassette station 302 for transferring, for example, 25 wafers W per cassette, as a unit, from/to the outside into/from the substrate processing apparatus 301 and carrying the wafer W into/out of a cassette C, a processing station 303 in which various kinds of processing units each for performing predetermined processing for the wafers W one by one are multi-tiered, and an interface section 304 for transferring the wafer W to/from an aligner (not illustrated) adjacent to the processing station 303 are integrally connected.

In the cassette station 302, the cassettes C can be freely mounted with respective transfer ports for the wafer W facing the side of the processing station 303 on a cassette mounting table 305 in the X-direction. A wafer transfer body 306 movable in the direction of arrangement of the cassettes C (the X-direction) and in the direction of arrangement of the wafers W housed in the cassette C (the Z-direction; the vertical direction) is movable along a transfer path 307 and selectively accessible to each of the cassettes C. The wafer transfer body 306 is also structured to be rotatable in the θ-direction so as to be accessible to an extension unit 354 and an alignment unit 353 of a first heat processing group 350 and an extension and cooling unit 382, an extension unit 383, and cooling units 381 and 384 of a fourth heat processing unit group 380, which will be described later. A second defective substrate collecting cassette 324 as the second defective substrate collecting means disposed at the end of a second transfer route 340A is mounted on the cassette mounting table 305. The wafer W processed through the second transfer route 340A is transferred to second inspection equipment 323 for inspecting film thickness, film quality, and the like of a patterning film after developing processing by the wafer transfer body 306 to undergo an inspection. The wafer W which is judged to be defective by the inspection is collected by the second defective substrate collecting cassette 324.

In the processing station 303, a film forming unit group 310 and a developing processing unit group 315 are arranged respectively.

In the film forming unit group 310, antireflection film forming units 311 and resist coating processing units 312 are arranged in two rows while being three-tired respectively.

In the developing processing unit group 315, developing processing units 316 are disposed in two rows while being two-tiered.

A space portion 320 is formed in the central portion of the processing station 303, and the space portion 320 communicates with a door 396 which is provided in the interface section 304 to freely open and shut and described later. The film forming unit group 310 and the developing processing unit group 315 are disposed facing each other with a space between them across the space portion 320. A first transfer means 330 for transferring the wafer W which is arranged between the film forming unit group 310 and the space portion 320 and a second transfer means 340 which is arranged between the developing processing unit group 315 and the space portion 320 are disposed facing each other.

The first transfer means 330 transfers the wafer W before exposure processing through a first transfer route 330A, and the second transfer means 340 transfers the wafer W after exposure processing through a second transfer route 340A. The first transfer means 330 and the second transfer means 340 have basically the same structure, and respectively have tweezers 337 and 347 each for holding the wafer W.

A first heat processing unit group 350 and a second heat processing unit group 360 are disposed respectively on both sides of the first transfer means 330, and a third heat processing unit group 370 and a fourth heat processing unit group 380 are disposed respectively on both sides of the second transfer means 340. The first heat processing unit group 350 and the fourth heat processing unit group 380 are arranged on the cassette station 302 side, and the second heat processing unit group 360 and the third heat processing unit group 370 are arranged on the interface section 304 side, respectively.

Figure 8:
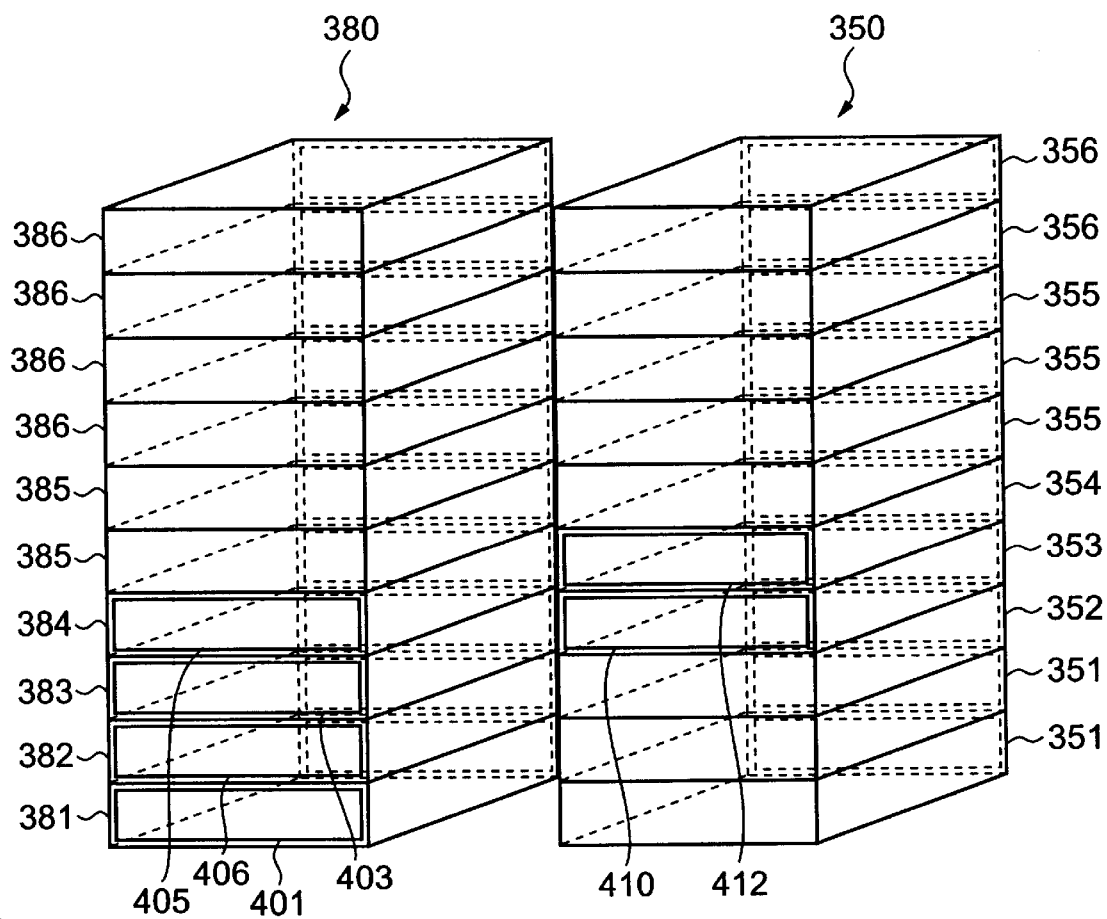
FIG. 8 is a perspective view of processing unit groups as seen from a cassette station side of the substrate processing apparatus in FIG. 7.

The structure of the first heat processing unit group 350 and the fourth heat processing unit group 380 will be explained by means of FIG. 8.

In the first heat processing unit group 350, cooling units 351 and 351 each for performing cooling processing for the wafer W, an adhesion unit 352 for performing hydrophobic processing for the front surface of the wafer W, an alignment unit 353 for aligning the wafer W, an extension unit 354 for making the wafer W wait, pre-baking units 355 each for performing heat processing for the wafer W after resist coating processing, and post-baking units 356 each for performing heat processing for the wafer W after developing processing are ten-tiered from the bottom in order. The transfer of the wafer W between the cassette station 302 and the first heat processing unit group 350 is performed via an opening 410 formed in the alignment unit 353 or an opening 412 formed in the extension unit 354.

The transfer of the wafer W mounted on the cassette mounting table 5 to/from the first heat processing unit group 50 is performed via an opening provided in the extension unit in the first embodiment, whereas the transfer of the wafer W can be performed also via the opening 410 formed in the alignment unit 353 in addition to the opening 412 formed in the extension unit 354 in this embodiment. Hence, the wafer W can be carried into the alignment unit 353 without passing through the extension unit 354, and consequently a place into which the wafer W is to be carried can be decided according to processing conditions of wafers inside the substrate processing apparatus, thereby improving a throughput.

Meanwhile, in the fourth heat processing unit group 380, a cooling unit 381, an extension and cooling unit 382 for cooling the wafer W which is made to wait, an extension unit 383, a cooling unit 384, post-exposure baking units 385 for performing heat processing for the wafer W after exposure processing, and post-baking units 386 for performing heat processing for the wafer W after developing processing are ten-tiered from the bottom in order. The transfer of the wafer W between the cassette station 302 and the fourth heat processing unit group 380 is performed via openings 401, 405, 406, and 403 respectively formed in the cooling units 381 and 384, the extension and cooling unit 382, and the extension unit 383.

The transfer of the wafer W between the cassette station 2 and the fourth heat processing unit group 80 is performed via openings provided in the extension unit and the extension and cooling unit in the first embodiment, while the transfer of the wafer W can be performed also via the openings 401 and 405 in the cooling units 381 and 384 in addition to the opening 403 formed in the extension unit 383 and the opening 406 formed in the extension and cooling unit 382 in this embodiment. Accordingly, the wafer W can be transferred without passing through the extension unit 383 and the extension and cooling unit 382. As a result, the wafer W can be taken out directly from within the cooling units 381 and 384, and thus a place from which the wafer W is to be taken out can be decided according to processing conditions of wafers inside the substrate processing apparatus, thereby improving a throughput.

In the interface section 304, a peripheral aligner 390 for exposing the peripheral portion of the wafer W, a cassette 391 capable of housing the wafer W, a cooling mounting table 392 on which the wafer W exposed in the aligner (not illustrated) is mounted and cooled, a wafer transfer body 393 for transferring the wafer W between the cassette 391, the cooling mounting table 392, and the aligner (not illustrated), and a wafer transfer body 394 for transferring the wafer W between the extension units of the second heat processing unit group 360, the peripheral aligner, and the cassette 391 are provided. Further, a first defective substrate collecting cassette 322 as the first defective substrate collecting means disposed at the end of the first transfer route 330A is mounted in the interface section 304. The wafer W processed through the first transfer route 330A is transferred to first inspection equipment 321 for inspecting film thickness, film quality, and the like of a formed film by the wafer transfer body 394 to undergo an inspection. The wafer W which is judged to be defective by the inspection is collected by the first defective substrate collecting cassette 322.

A sub-transfer body 395 is provided on the opposite side to the peripheral aligner 390 across the wafer transfer body 394. The sub-transfer body 395 is able to receive the wafer W transferred by the wafer transfer body 394 and carry the wafer W into the extension unit of the third heat processing unit group 370. Further provided in the interface section 304 is the aforesaid door 396 which freely opens and shuts and communicates with the space portion 320 of the processing station 303, so that the operator can enter the space portion 320 from the interface section 304 by opening the door 396.

In this embodiment, the transfer routes respectively for film forming processing performed before exposure processing by the aligner not illustrated and for developing processing after exposure processing are provided independently of each other, whereby defective substrate collecting cassettes can be provided respectively in the transfer routes 330A and 340A to efficiently collect defective substrates from film forming processing and defective substrates from developing processing respectively. Further, substrates judged to be defective in processing performed in the first transfer route are collected, and thus substrates to be committed to the aligner are all non-defective substrates. As a result, the proportion which defective substrates account for out of substrates formed through a series of processing steps of film forming processing, exposure processing, and developing processing is reduced, which makes it possible to efficiently fabricate non-defective substrates.

Incidentally, although the aforesaid embodiments are explained with the given examples in which the wafer W is used as a substrate, a substrate usable to the present invention is not limited to the wafer W, and an LCD substrate, a CD substrate, and the like, for example, also can be used.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:
    a plurality of first processing units, disposed along a first transfer route, each for processing a substrate;
    a plurality of second processing units, disposed along a second transfer route, for processing the substrate after the substrate processed in the first processing unit is processed in a processing apparatus; and
    transfer means for transferring the substrate between the plurality of first processing units disposed along the first transfer route and transferring the substrate between the plurality of second processing units disposed along the second transfer route,
    wherein the transfer means comprises:
        first transfer means for transferring the substrate between the first processing units along the first transfer route; and
        second transfer means for transferring the substrate between the second processing units along the second transfer route,
    said the substrate processing apparatus further comprising a third transfer means for transferring the substrate processed by said plurality of first processing units, to an apparatus external to the first and second processing units and for transferring the substrate processed by the external apparatus to said plurality of second processing units; and
    wherein the second processing unit further has:
        a chemical filter disposed on top of the second processing unit; and
        a mechanism for letting air inside the second processing unit flow downward from above.

2. The apparatus as set forth in claim 1,
    wherein the first processing unit and the second processing unit are disposed with a space between them.

3. The apparatus as set forth in claim 1,
    wherein the first processing units or the second processing units are multi-tiered.

4. The apparatus as set forth in claim 1,
    wherein the first processing units have at least one film forming unit, and
    wherein the second processing units have at least one developing processing unit for performing developing processing for the substrate which has undergone exposure processing in the processing apparatus.

5. The apparatus as set forth in claim 4,
    wherein the second processing unit further has:
        an HEPA filter disposed on top of the second processing unit.

6. The apparatus as set forth in claim 5, further comprising:
    a first control mechanism for controlling temperature and humidity inside the first processing unit; and
    a second control mechanism for controlling temperature inside the second processing unit.

7. The apparatus as set forth in claim 4,
    wherein the first processing units have at least one film forming pre-processing unit, the apparatus further comprising:
        a mounting table on which the substrate to be supplied to the film forming pre-processing unit is mounted,
        wherein the film forming pre-processing unit has an opening through which the substrate is transferred to the film forming pre-processing unit from the mounting table.

8. The apparatus as set forth in claim 4,
    wherein the second processing units have at least one developing post-processing unit, the apparatus further comprising:
        a mounting table on which the substrate processed in the developing post-processing unit is mounted,
        wherein the developing post-processing unit has an opening through which the substrate is transferred to the mounting table from the developing post-processing unit.

9. The apparatus as set forth in claim 1, further comprising:
    first defective substrate collecting means disposed at the end of the first transfer route; and
    second defective substrate collecting means disposed at the end of the second transfer route.

10. The apparatus as set forth in claim 1, further comprising:
    first inspection equipment for inspecting the substrate processed in the first processing unit; and
    second inspection equipment for inspecting the substrate processed in the second processing unit.

11. The apparatus as set forth in claim 10, further comprising:
    first defective substrate collecting means, disposed at the end of the first transfer route, for collecting a substrate judged to be defective by the first inspection equipment; and
    second defective substrate collecting means, disposed at the end of the second route, for collecting a substrate judged to be defective by the second inspection equipment.

12. A substrate processing apparatus, comprising:
    a plurality of first processing units, disposed along a first transfer route, each for processing a substrate;
    a plurality of second processing units, disposed along a second transfer route arranged nearly parallel to the first transfer route with a space between the first processing unit and the second processing unit for processing the substrate after the substrate processed in the first processing unit is processed in a processing apparatus; and
    transfer means for transferring the substrate between the plurality of first processing units disposed along the first transfer route and transferring the substrate between the plurality of second processing units disposed along the second transfer route,
    wherein the transfer means comprises:
        first transfer means for transferring the substrate between the first processing units along the first transfer route; and second transfer means for transferring the substrate between the second processing units along the second transfer route, said the substrate processing apparatus further comprising a third transfer means for transferring the substrate processed by said plurality of first processing units, to an apparatus external to the first and second processing units and for transferring the substrate processed by the external apparatus to said plurality of second processing units and wherein said first processing units having at least one film forming unit for forming a film on a substrate; and said second processing units having at least one developing processing unit for performing developing processing for the substrate after the substrate processed in the first processing unit undergoes exposure processing, the second processing unit having a chemical filter disposed on the top of the second processing unit and a mechanism for letting air inside the second processing unit flow downward from above.

13. The apparatus as set forth in claim 12 wherein:

first processing units, disposed along a first transfer route, having at least one film forming unit for forming a film on a substrate; and second processing units, disposed along a second transfer route, having at least one developing processing unit for performing developing processing for the substrate after the substrate processed in the first processing unit undergoes exposure processing.

14. The apparatus as set forth in claim 12 further comprising:

first defective substrate collecting means disposed at the end of the first transfer route; and second defective substrate collecting means disposed at the end of the second transfer route.

* * * * *